United States Patent
Tomomatsu et al.

(10) Patent No.: US 8,138,532 B2
(45) Date of Patent: Mar. 20, 2012

(54) PIN PHOTODIODE AND MANUFACTURING METHOD OF SAME

(75) Inventors: Hiroyuki Tomomatsu, Oita-Ken (JP); Yukihisa Hirotsugu, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 12/510,384

(22) Filed: Jul. 28, 2009

(65) Prior Publication Data

US 2010/0019293 A1 Jan. 28, 2010

(30) Foreign Application Priority Data

Jul. 28, 2008 (JP) .................................. 2008-193139

(51) Int. Cl.
*H01L 31/062* (2006.01)
(52) U.S. Cl. .. 257/292; 257/290; 257/291; 257/E31.073
(58) Field of Classification Search .................. 257/290, 257/291, 292, E31.079
See application file for complete search history.

(56) References Cited

U.S. PATENT DOCUMENTS

2009/0016200 A1  1/2009  Tomomatsu et al.

FOREIGN PATENT DOCUMENTS

JP  2001-320079  11/2001
JP  2007-179604  7/2007

OTHER PUBLICATIONS

Meinhardt et al., "High-speed blue-, red-, and infrared-sensitive photodiode integrated in a 0.35 μm SiGe:C-BiCMOS process", IEDM 2005.
A. T. Krishnan et al., Material Dependence of Hydrogen Diffusion: Implications for NBTI Degradation, IEDM 2005.

*Primary Examiner* — Tan N Tran
(74) *Attorney, Agent, or Firm* — Alan A. R. Cooper; Jacqueline J. Garner; Frederick J. Telecky, Jr.

(57) ABSTRACT

The objective of this invention is to provide a semiconductor device containing a photodiode and having stable, high sensitivity with respect to short wavelength light near 405 nm, and a manufacturing method for said semiconductor device. PIN photodiode (100C) has the following layers formed on silicon substrate (110): p-type silicon region (112), n-type silicon layer (114), field oxide film (118), silicon oxide film (120c) that covers the surface of the active region, and silicon nitride film (122c) that covers silicon oxide film (120c). Said field oxide film (118) contains extending portions (160) extending to the interior of the active region; the side portions of extending portions (160) are connected to silicon oxide film (120c), and the exposed surface portions of extending portions (160) become regions for hydrogen diffusion.

8 Claims, 14 Drawing Sheets

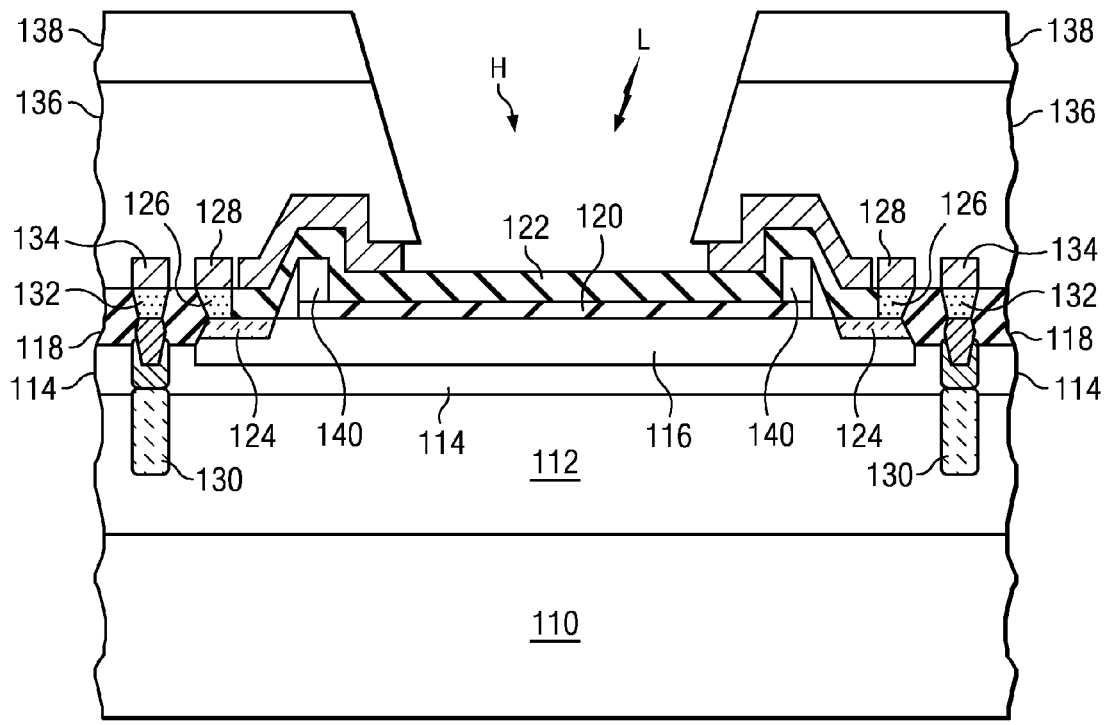
FIG. 2 *(PRIOR ART)*
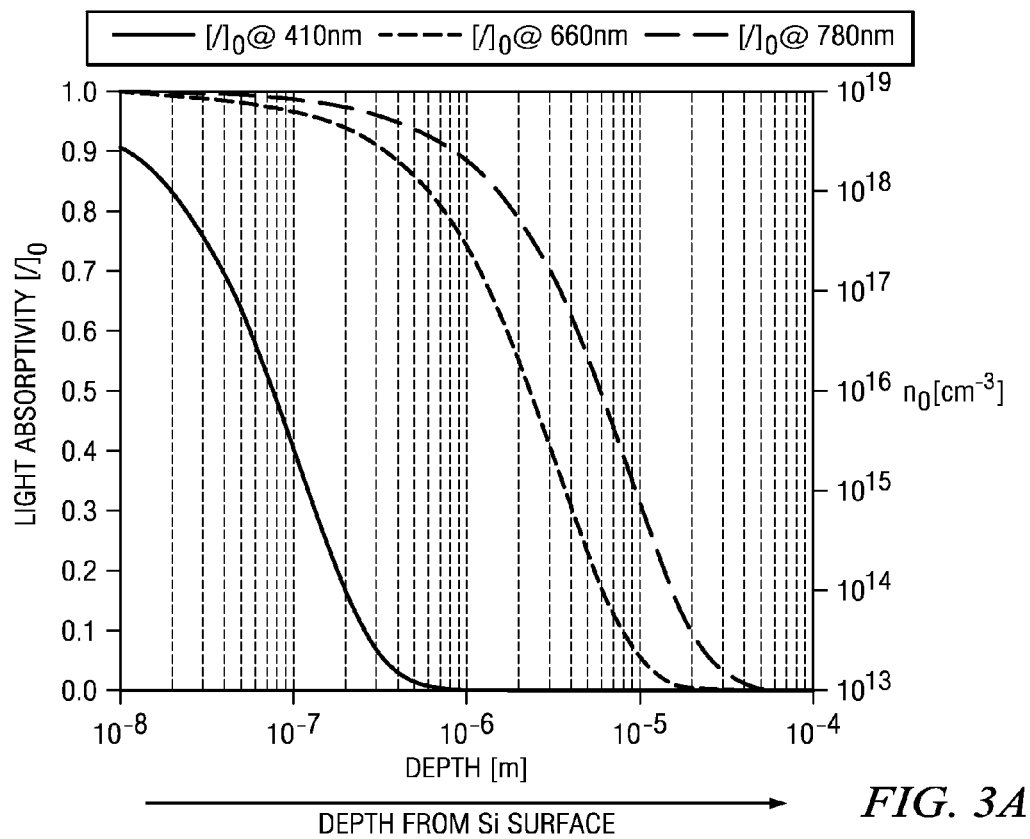
*FIG. 3A*

| DIFFUSING SPECIES | DIFFUSION MEDIUM | DISTANCE DIFFUSED x (x(nm)-sqrt (4Dt) t=1s; T=105°C) | REFERENCE |
|---|---|---|---|
| $H_2$ | $SiO_2$ | 4.8E+02 | Ogawa et. al., Phys. Rev. B, 51 4218 (1995) |
| $H_2$ | $SiO_2$ | 2.3E+01 | B. Fishbein et. al., J. Electrochem Soc. 134 674 (1987) |
| H | $SiO_2$ | 8.4E+04 | B. Tuttle. Phys. Rev. B, 61, 4417 (2000) |
| H | $SiO_2$ | 1.5E+04 | D. L. Griscom, J. Appl. Phys., 58, 2524 (1986) |
| $H_2$ | Poly-Si | 5.9E-01 | N. H. Nickel et. al., Phys. Rev. B, 52 7791 (1995) |
| $H_2$ | Poly-Si | 9.4E+01 | B. L. Sopon et. al., Appl. Phys. Lett, 61, 2560 (1992) |
| H+/H0 | c-Si | 3.5E-01 | Y. L. Huang et. al., J. Appl. Phys., 96, 7080 (2004) |
| $H_2$ | c-Si | 3.7E+01 | B. L. Sopon et. al., Appl. Phys. Lett, 61, 2560 (1992) |
| $H/H_2$ | SiN | 9.9E-04 | S. S. He et. al., 4th intl. Conf. Sol. St and IC tech, 269 (1995) |
| $H/H_2$ | SiN | 7.8E-14 | A. Bik et. al., Appl. Phys. Lett. 56, 2532 (1990) |

*FIG. 3B*

PIN PHOTODIODE AND MANUFACTURING METHOD OF SAME

FIELD OF THE INVENTION

The present invention pertains to a photodiode for use in an optical pickup element or other light-receiving element. Especially, the present invention pertains to a PIN photodiode that receives light with high sensitivity for the wavelength of blue light.

A PIN photodiode has a P-I-N structure having an intrinsic layer (high-resistance epitaxial layer or the like) between a p-type semiconductor and an n-type semiconductor, and it is an element with which incident light is transformed to a photocurrent. The principle is as follows: when light with energy higher than the energy ban gap is incident on silicon (Si) having a PIN structure with a reverse bias applied on it, electron-hole pairs are generated. The electron-hole pairs have electrons move to n-type layer and holes move to p-type layer, and a current is output in the backward direction.

Patent Reference 1 disclosed a photodiode with the following structure shown in FIG. 1: plural p-type semiconductor layers (12) are formed in a checkerboard pattern in n-type semiconductor layer (11), and anti-reflection film AR consisting of silicon oxide film (25) and silicon nitride film (26) is formed on the surface of the silicon.

[Patent Reference 1] Japanese Kokai Patent Application No. 2001-320079

BACKGROUND OF THE INVENTION

Due to its properties, silicon can convert only light with a wavelength in the range of 400 nm to 1100 nm to photocurrent that is output. The reason is as follows: the photo energy of light with a wavelength of 1100 nm or longer is lower than the energy band gap of silicon (1.12 eV), so it cannot generate electron-hole pairs. Also, short-wavelength light can generate electron-hole pairs only near the silicon surface. Usually, on the surface of silicon, the recombination rate is very high, so the electron-hole pairs generated under light at a wavelength of 400 nm or shorter immediately recombine and the photocarriers are annihilated in the silicon.

For a PIN photodiode, there are two important characteristics, that is, the sensitivity (photoelectric conversion efficiency) and the BW (response speed). Based on the basic principle of a PIN photodiode, FIG. 2 shows the cross-section of a PIN photodiode with a constitution in consideration of said two important characteristics with respect to the wavelength of blue light ($\lambda$=405 nm).

For PIN photodiode (100) shown in FIG. 2, on high-concentration p-type single crystal silicon substrate (110), low-concentration p-type silicon layer (112) is formed by means of epitaxial growth, low-concentration n-type silicon layer (114) is formed by epitaxial growth, and intermediate-concentration n-type silicon region (116) having a prescribed depth from the surface of silicon layer (114) is formed. When a reverse bias voltage is applied, a depletion region is formed that spreads up/down from the joint surface between silicon layer (112) and silicon layer (114).

Said silicon region (116) is defined by field oxide film (118). By means of thermal oxidation, silicon oxide film (120) is formed on said silicon region (116), and silicon nitride film (122) is formed on silicon oxide film (120). Said silicon oxide film (120) and silicon nitride film (122) form an anti-reflection film.

On the two end portions of n-type silicon region (116), high-concentration n-type contact region (124) is formed, and said contact region (124) is electrically connected via platinum silicide layer (126) (PtSi) to electrode (128). Also, high-concentration p-type contact region (130) is formed via n-type silicon layer (114) and extending into p-type silicon layer (112). Said contact region (130) is electrically connected via platinum silicide layer (132) (PtSi) to electrode (134).

In addition, on the silicon substrate, multi-layer wiring region (136) and protective film (138) are formed. On multi-layer wiring region (136) and protective film (138), opening H is formed for exposing silicon nitride film (122). Said opening H defines the light-receiving surface of the PIN photodiode. When a reverse bias voltage is applied on electrode (128) on the cathode side and electrode (134) on the anode side, a depletion region is formed from the interface between silicon layer (112) and silicon layer (114). The depletion region almost reaches the silicon surface region, and, when blue light is incident on opening H, electron-hole pair carriers are generated in the depletion region. Here, the electrons move to electrode (128) on the cathode side, and the holes move to electrode (134) on the anode side. As a result, a photocurrent is output.

For a PIN photodiode, as for the photodiode shown in FIG. 1, if an electrode is not present on the light-receiving surface, a decrease in the light quantity incident on the depletion region can be suppressed. On the other hand, if an electrode is not arranged on the light-receiving surface, the movement distance of the carriers generated in the depletion region near the silicon surface increases, and the proportion of annihilation by recombination becomes high. Especially, if plural silicon unbonded bonds (dangling bonds) are present on the surface of the silicon, the carriers are trapped in the trap level of the silicon interface, and the probability of annihilation of the carriers by recombination increases. When silicon oxide film (120) is formed by thermal oxidation on silicon region (116), the number of dangling bonds of silicon decreases and the interface trap phenomenon can be suppressed to a minimum level.

In addition, if the resistance of the silicon surface is high, the carrier movement velocity falls, and the response speed decreases. However, intermediate-concentration n-type silicon region (116) is formed at a prescribed depth from the surface of n-type silicon layer (114), so carriers generated near the silicon surface move through silicon region (116) near the low-resistance silicon surface, and the decrease in response speed can be suppressed.

However, for the photodiode shown in FIG. 2, a wafer with a problem of low sensitivity is generated. Here, the problem of poor sensitivity occurs when light at a wavelength of 405 nm (blue-violet light) is incident.

The present inventors have concentrated on the cause of generation of the problem of poor sensitivity with regard to the silicon-oxide film interface at the surface of a photodiode and that most significantly affects the sensitivity when light at a wavelength of 405 nm is incident. With regard to the wavelength of light and the properties of silicon, light at a wavelength of 405 nm can reach only the vicinity of the surface of silicon, so the generated photo carriers are significantly dependent on the silicon surface state. FIG. 3A shows the relationship between light absorptivity and the depth from the silicon surface by means of relationships with the wavelength at 410 nm, 660 nm and 780 nm, respectively. The wavelength at 410 nm can reach only a depth of about $1 \times 10^{-6}$.

Consequently, if many dangling bonds of silicon are present on the silicon surface, the carriers generated under incident light at a wavelength of 405 nm are trapped on the dangling bonds and are annihilated during the period of movement when the carriers are attracted by the electric field to move to the electrodes, so conversion to and output of photocurrent does not occur. This is one of the reasons for the problem of poor sensitivity of a PIN photodiode.

For the photodiode shown in FIG. 2, since the silicon oxide film is formed as said thermal oxide film, dangling bonds are minimized, and the problem of poor sensitivity can be alleviated. However, due to dispersion in the manufacturing process and stress in reliability testing, silicon dangling bonds are still generated, and said problem of poor sensitivity at 405 nm occurs.

The objective of the present invention is to solve the aforementioned problems of the prior art by providing a manufacturing method for a semiconductor device containing a photodiode characterized by the fact that it has stable high sensitivity for short-wavelength light near 405 nm.

SUMMARY OF THE INVENTION

The present invention provides a semiconductor device characterized by the following facts: a semiconductor device containing a photodiode has the following parts: a first silicon layer of a first electroconductive type formed on a substrate, a second silicon layer of a second electroconductive type formed on said first silicon layer, a silicon oxide region defining the active region of the second silicon layer, a silicon oxide film covering the surface of said active region, and a silicon nitride film that covers at least said silicon oxide film; the side portion of said silicon oxide region is connected to said silicon oxide film, and the surface of at least a portion of said silicon oxide region is exposed as a region for hydrogen diffusion; and said photodiode detects light incident on said active region. In a preferred scheme, said silicon oxide region contains at least one extending portion that extends into the interior of said active region, and the side portion of said at least one extending portion is connected to said silicon oxide film.

Also, the present invention provides a semiconductor device characterized by the following facts: a semiconductor device containing a photodiode has the following parts: a first silicon layer of a first electroconductive type formed on a substrate, a second silicon layer of a second electroconductive type formed on said first silicon layer, a silicon oxide region defining the active region of the second silicon layer, a silicon oxide film covering the surface of said active region, a gate electrode material formed on said silicon oxide film, a side-wall oxide formed on the side wall of the gate electrode material, and a silicon nitride film that covers at least said silicon oxide film; the side wall oxide is connected to said silicon oxide film, and at least a portion of said side wall oxide is exposed as a region for hydrogen diffusion; and said photodiode detects light incident on said active region. Here, in a preferred scheme, the semiconductor device also has a peripheral circuit containing a MOS transistor electrically connected to said photodiode; said gate electrode material is electrode material formed when the gate of said MOS transistor is formed; and said side wall oxide is silicon oxide formed at the same time that the side wall oxide is formed on the side wall of the gate. In addition, in a preferred scheme, said gate electrode material is formed along the outer periphery of said active region, and said side wall oxide is formed on the outer side of said gate electrode material.

Also, the present invention provides a semiconductor device characterized by the following facts: a semiconductor device containing a photodiode has the following parts: a first silicon layer of a first electroconductive type formed on a substrate, a second silicon layer of a second electroconductive type formed on said first silicon layer, a silicon oxide region defining the active region of the second silicon layer, a silicon oxide film covering the surface of said active region, a silicon nitride film that covers at least said silicon oxide film, a silicide layer that is formed along the outer periphery of said active region and via a connection region formed between said silicon oxide region and said silicon oxide film, and an electrode formed on said silicide layer; the side portion of said silicide layer is connected to said silicon oxide film, and at least a portion of the surface of said silicide layer is exposed as a region for hydrogen diffusion; said photodiode detects light incident on said active region. In a preferred scheme, said silicide layer is a platinum silicide layer, and the side portion of said silicide layer is connected via the side wall oxide of the gate electrode material to said silicon oxide film.

In a preferred scheme, the second silicon layer contains a high-impurity-concentration region at a prescribed depth from its surface, and said silicon oxide film is formed by means of thermal oxidation.

The present invention provides a manufacturing method for a semiconductor device characterized by the following facts: in a manufacturing method for a semiconductor device having a photodiode, there are the following steps of operation: a substrate having a first silicon layer of a first electroconductive type and a second silicon layer of a second electroconductive type formed on said first silicon layer is prepared, a silicon oxide region specifying the active region of the second silicon layer is formed, a silicon oxide film is formed to cover the surface of said active region; a silicon nitride film is formed to cover said silicon oxide film, and hydrogen sintering is performed; a portion of the surface of said silicon oxide region is exposed for hydrogen diffusion, a portion of the side portion of said silicon oxide region is connected to said silicon oxide film, and hydrogen is diffused to the exposed surface of said silicon oxide region by means of said hydrogen sintering.

In addition, the present invention provides a manufacturing method for a semiconductor device characterized by the following facts: in a manufacturing method for a semiconductor device having a photodiode, there are the following steps of operation: a substrate having a first silicon layer of a first electroconductive type and a second silicon layer of a second electroconductive type formed on said first silicon layer is prepared, a silicon oxide region defining the active region of said second silicon layer is formed, a silicon oxide film is formed to cover the surface of said active region, a gate electrode material is formed on said silicon oxide film, a side wall oxide connected to said silicon oxide film is formed on the side surface of said gate electrode material, a silicon nitride film is formed to cover at least said silicon oxide film, and hydrogen sintering is performed; by means of said hydrogen sintering, hydrogen is diffused from said side wall oxide.

In addition, the present invention provides a manufacturing method for a semiconductor device characterized by the following facts: in a manufacturing method for a semiconductor device having a photodiode, there are the following steps of operation: a substrate having a first silicon layer of a first electroconductive type and a second silicon layer of a second electroconductive type formed on said first silicon layer is prepared, a silicon oxide region defining the active region of said second silicon layer is formed, a silicon oxide film is formed to cover the surface of said active region, a silicon nitride film is formed to cover the surface of said active region, a silicide layer connected to said silicon oxide film and electrically connected to said second silicon layer is formed, and hydrogen sintering is performed; by means of said hydrogen sintering, hydrogen is diffused from the exposed portion of said silicide layer.

BRIEF DESCRIPTION OF THE DRAWINGS

FIG. 2 is a cross-sectional view illustrating the constitution of a PIN photodiode as a modification of the PIN photodiode in the prior art.

FIG. 3A is a graph illustrating the relationship between light absorptivity at individual wavelengths and the penetrating depth from the surface of silicon FIG. 3B is a diagram illustrating the relationship between hydrogen diffusion and material.

FIG. 5.

FIG. 12.

REFERENCE NUMERALS AND SYMBOLS AS SHOWN IN DRAWINGS

In the FIGS. 100A, 100B, and 100C represent PIN photodiodes, 110 represents a p-type silicon substrate, 112 represents a low-concentration p-type silicon layer, 114 represents a low-concentration n-type silicon layer, 116 represents an intermediate-concentration n-type silicon region, 118 represents a field oxide film, 118a represents an end portion of field oxide film, 120, 120a, 120b, and 120c represent silicon oxide films, 122, 122b, and 122c represent silicon nitride films, 124 represents a high-concentration n-type contact region, 126 represents a platinum silicide layer, 128 represents a cathode-side electrode, 130 represents a high-concentration p-type contact region, 132 represents a silicide layer, 134 represents an anode-side electrode, 136 represents a multi-layer wiring region, 138 represents a protective film, 140 represents a polysilicon layer, 142 represents a side wall oxide, 144 represents a metal film, 146 represents an exposed portion, 150 represents a mask, 152 represents an opening, 154 represents an ion implanting, 160 represents an extending portion, and H represents an opening.

DETAILED DESCRIPTION OF THE EMBODIMENTS

According to the present invention, hydrogen is diffused to a silicon oxide film formed on the silicon surface. Consequently, silicon dangling bonds can be hydrogen-terminated, trapping of photo-carriers by silicon dangling bonds is suppressed, and the poor sensitivity for light near a wavelength of 405 nm can be alleviated. In addition, since hydrogen diffusion is possible, even if dispersion occurs in the manufacturing process, generation of silicon dangling bonds can still be efficiently suppressed.

Optimum Embodiment of the Present Invention

In the following, an explanation will be given in more detail regarding the optimum embodiment of the present invention with reference to the figures. Here, as an example, a PIN photodiode is shown. It is used as the light-receiving element of an optical pickup having a blue light source for read of data of a DVD or other recording medium or for write of data. Here, the scale shown in the figures may not agree with the scale of a practical product. Instead, the characteristic portion is shown enlarged.

Embodiments

Figure 1A:
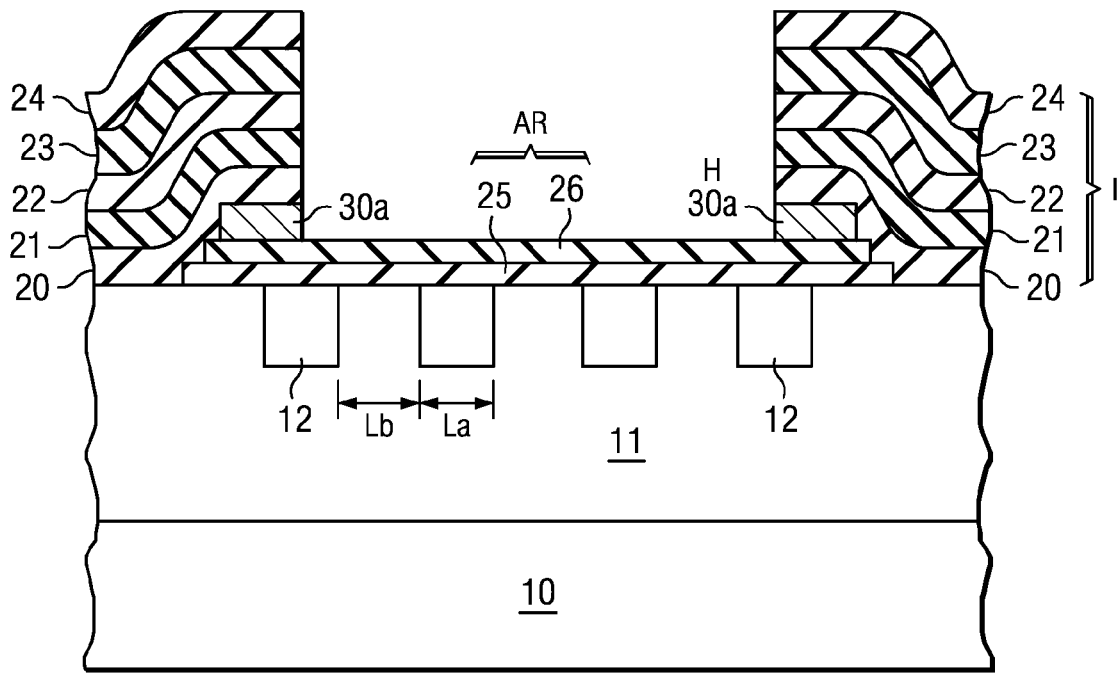
FIG. 1 is a cross-sectional view illustrating the constitution of a PIN photodiode in the prior art.
Figure 1B:
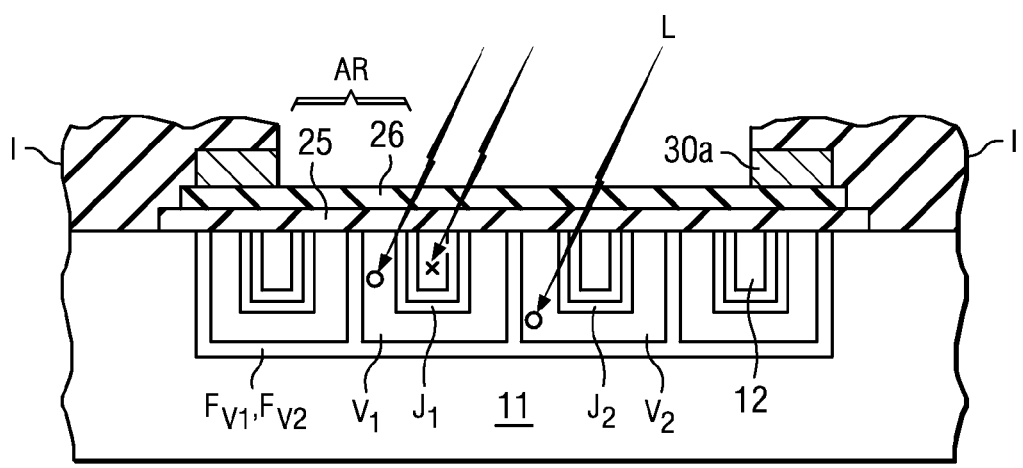
Figure 4:
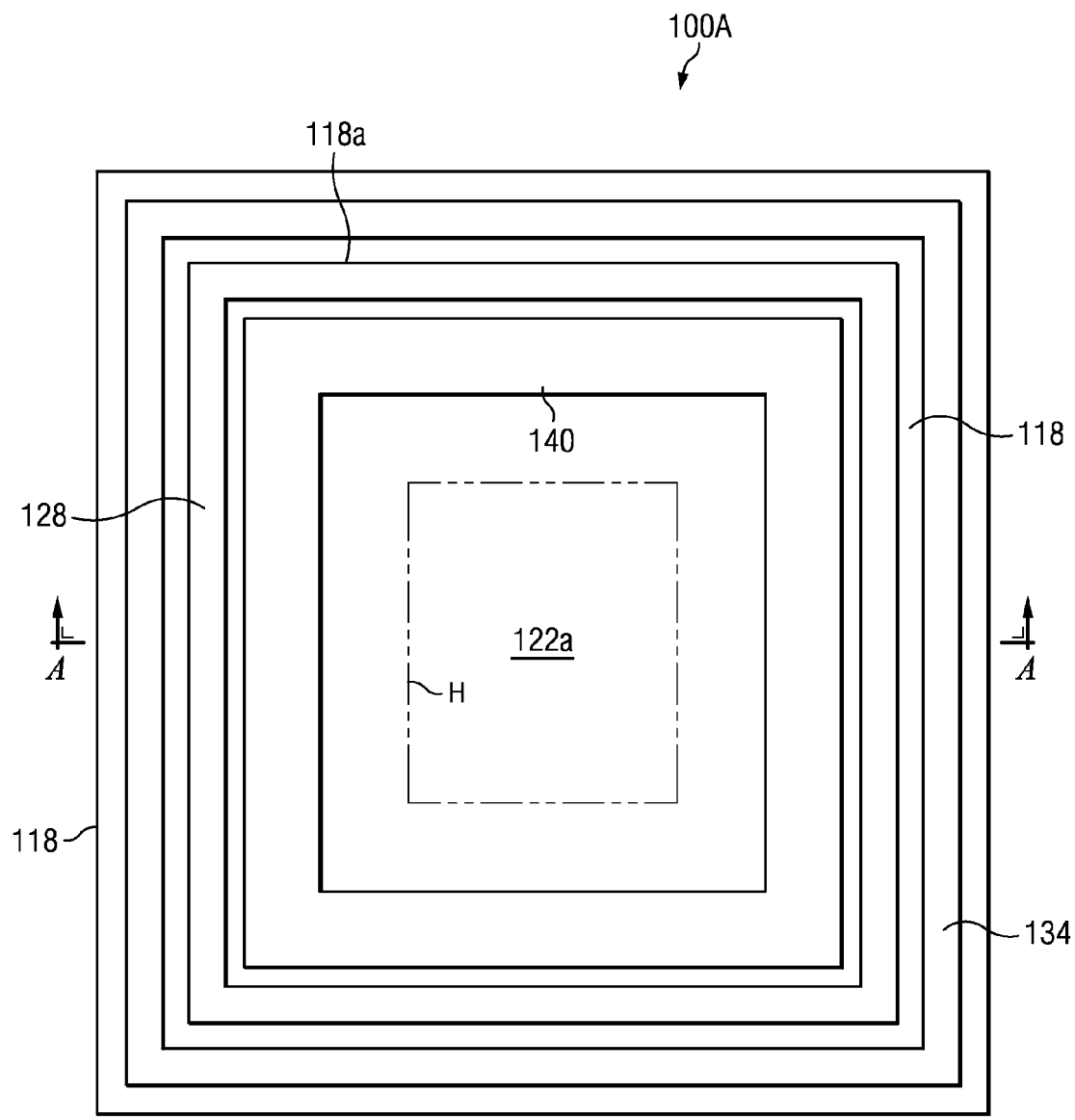
FIG. 4 is a schematic plan view illustrating the active region of the PIN photodiode in Embodiment 1 of the present invention.
Figure 5A:
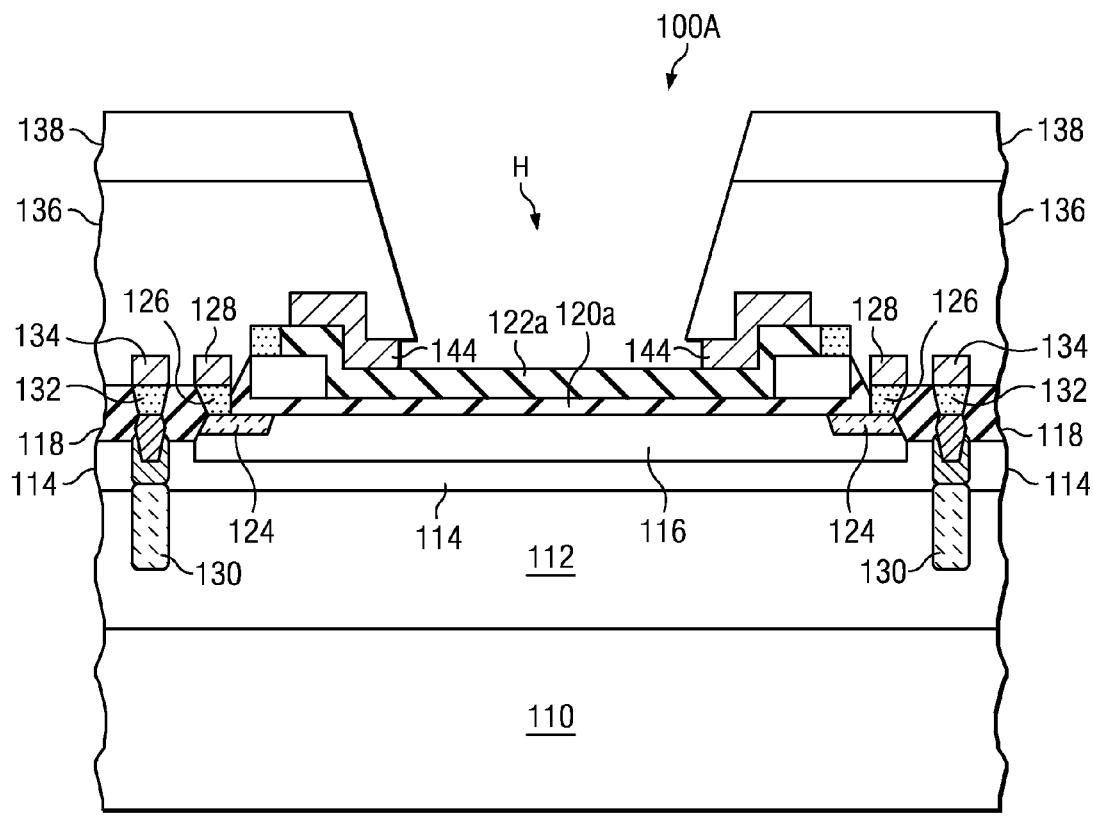
FIG. 5A is a cross-sectional view taken across A-A in FIG. 4.
Figure 5B:
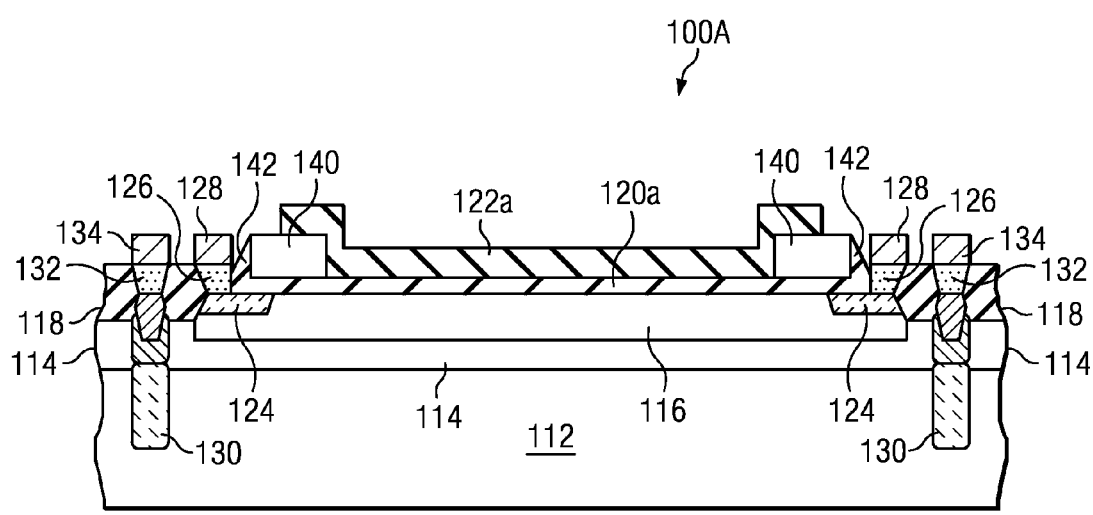
FIG. 5B extracts the main portion of FIG. 5A, and it is a cross-sectional view illustrating the characteristic portion.

In the following, an explanation will be given regarding a PIN photodiode in Embodiment 1 of the present invention. FIG. 4 is a schematic plan view illustrating the active region of the photodiode. FIG. 5A is a cross-sectional view taken across A-A of FIG. 4. FIG. 5B extracts the main portion of FIG. 5A, showing the characteristic portion of Embodiment 1. The same symbols as those above in the structure of the photodiode shown in FIG. 2 are adopted here.

In Embodiment 1, PIN photodiode (100A) has the following layers formed on high-concentration p-type single crystal silicon substrate (110): low-concentration p-type silicon layer (112) formed by means of epitaxial growth, low-concentration n-type silicon layer (114) formed by means of epitaxial growth, intermediate-concentration n-type silicon region (116) having a prescribed depth from the surface of silicon layer (114), and field oxide film (118) formed on silicon layer (114).

As shown in FIG. 4, end portion (118a) of field oxide film (118) (indicated by a bold dot-dash line) defines the active region of silicon layer (114), and silicon region (116) with a prescribed depth is formed there. Adjacent to end portion (118a) of field oxide film (118), rectangular-shaped extending cathode-side electrode (128) is formed and, on its outer periphery, rectangular-shaped extending anode-side electrode (134) is formed. On the inner periphery of cathode-side electrode (128), rectangular-shaped extending polysilicon layer (140) is formed. Said polysilicon layer (140) is not directly related to the operation of photodiode (100A). On the inner side of polysilicon layer (140), rectangular-shaped opening H is formed to define the light-receiving surface of photodiode (100A).

The surface of silicon region (116) is covered with silicon oxide film (120a) formed by means of thermal oxidation. A rectangular-shaped connection region (silicon-exposed portion) is formed between the end portions of field oxide film (118) and silicon oxide film (120a). On said connection region, platinum silicide layer (126) (PtSi) is formed. On said platinum silicide layer (126), cathode-side electrode (128) is formed. Also, on the outer periphery of silicon region (116), high-concentration n-type contact region (124) is formed, and cathode-side electrode (128) is electrically connected via platinum silicide layer (126) to contact region (124).

On the outer periphery of silicon oxide film (120a), polysilicon layer (140) is formed. Said polysilicon layer (140) is formed at the same time that the gate electrode of the MOS transistor of a peripheral circuit is formed on the same substrate as the photodiode. In addition, as shown in FIG. 5B, on the side wall of polysilicon layer (140), side wall oxide (142) (side wall) made of silicon oxide is formed. Said side wall oxide (142) is formed at the same time that the side wall of the MOS transistor is formed. A portion of silicon oxide film (120a) and polysilicon layer (140) is covered with silicon nitride film (122a) as an anti-reflection film. Here, one should note that side wall oxide (142) is formed between platinum silicide layer (126) and polysilicon layer (140), and side wall oxide (142) is connected to silicon oxide film (120a) beneath A connection region (silicon-exposed portion) is formed at the position of field oxide film (118) corresponding to anode-side electrode (134), and, in this connection region, platinum silicide layer (132) (PtSi) is formed. Here, platinum silicide layer (132) is electrically connected via n-type silicon layer (114) to high-concentration p-type contact region (130) extending to p-type silicon region (112).

On the silicon substrate, multi-layer wiring region (136) and protective film (138) are formed. On said multi-layer wiring region (136) and protective film (138), rectangular-shaped opening H that defines the light-receiving surface is formed, and light L incident through opening H is incident via silicon nitride film (122a) onto the active region. Said multi-layer wiring region (136) contains multi-layer metal wiring and an interlayer insulating film formed between said layers. Said metal wiring electrically connects the photodiode and the peripheral circuit. The interlayer insulating film, for example, consists of a silicon oxide film formed by means of TEOS.

Also, when opening H is formed on multi-layer wiring region (136), a portion of metal film (144) used as an etching stopping layer is left on the end portion on silicon nitride film (122). It is preferred that metal film (144) be formed at the same time that cathode-side electrode (128) and anode-side electrode (134) are formed. For example, electrodes (128), (134) and metal film (144) are made of TiW/Al/TiN.

When a reverse bias voltage is applied on cathode-side electrode (128) and anode-side electrode (134), a depletion region extending in the up/down direction from the interface between silicon region (112) and silicon layer (114) is formed. The depletion region nearly reaches the silicon surface region. When blue light is incident into opening H, electron-hole pair carriers are generated in the depletion region. The electrons move to cathode-side electrode (128), and the holes move to anode-side electrode (134), and a photocurrent is detected.

Said photodiode (100A) in the present embodiment works as a region for hydrogen diffusion of side wall oxide (142). The relationship between diffusion of hydrogen and various materials, for example, is described in the graph shown in FIG. 3B in the following reference: "Material Dependence of Hydrogen Diffusion: Implications for NBTI Degradation," A. T. Krishnan, et al., Silicon Technology Development, Texas Instruments, 2005 IEEE. As a result, the hydrogen diffusion coefficient significantly depends on the material in which it diffuses, with the magnitude in the following order: silicon oxide>polysilicon>silicon>>nitride. The hydrogen diffusion coefficient of silicon oxide is 4 orders of magnitude higher than that of silicon, and it is 5 orders of magnitude higher than that of nitride. This means that hydrogen does not diffuse much except in silicon oxide.

For the photodiode, there should be an anti-reflection film on its surface, and a silicon nitride film with a reflectivity lower than that of silicon is formed on the surface. As shown in FIG. 2, when silicon nitride film (122) is formed to cover the entire surface of silicon oxide film (120), there is no diffusion path for hydrogen to the surface of the silicon, and, in fact, there is no diffusion of hydrogen to the silicon surface. On the other hand, for the photodiode in the present embodiment, side wall oxide (142) is not covered with silicon nitride film (122), and side wall oxide (142) is connected to silicon oxide film (120a), such that they form an oxide path for hydrogen diffusion. As a result, for example, with a hydrogen sintering treatment, hydrogen diffuses in side wall oxide (142) and silicon oxide film (120a) to reach the silicon surface, where it is bonded to the dangling bonds of silicon, and the dangling bonds of silicon can be terminated by hydrogen.

In the following, an explanation will be given regarding the manufacturing method for the PIN photodiode in Embodiment 1 with reference to FIGS. 6 and 7. As an example, the operation for forming a PIN photodiode and a MOS transistor of the peripheral circuit on a semiconductor substrate is shown.

Figure 6A:
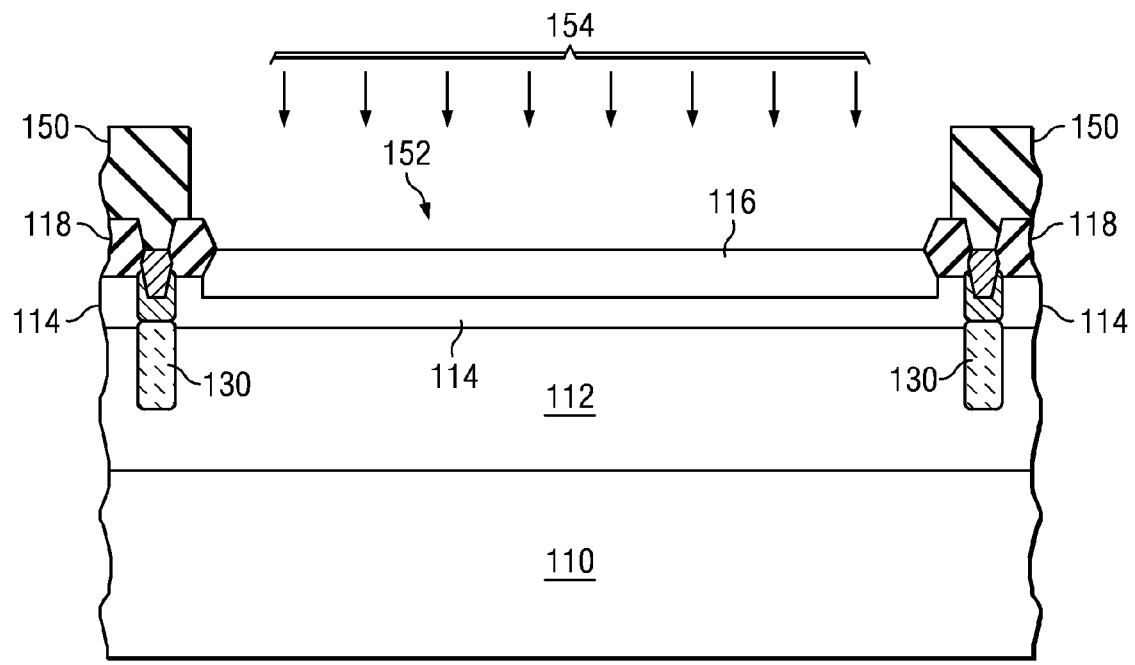
FIG. 6 is a schematic cross-sectional view illustrating the manufacturing operation for the PIN photodiode in Embodiment 1 of the present invention.

As shown in FIG. 6A, high-concentration p-type single crystal silicon substrate (110) is prepared. For example, boron may be used as the impurity implanted in silicon substrate (110). On silicon substrate (110), low-concentration p-type silicon layer (112) is formed by means of epitaxial growth. In addition, on silicon region (112), low-concentration n-type silicon layer (114) is formed by means of epitaxial growth. Also, high-concentration p-type contact region (130) is formed at a depth to reach low-concentration p-type silicon layer (112) from field oxide film (118). Said contact region (130) is formed by means of ion implanting of B (boron).

On the silicon substrate with said constitution, mask (150) having opening (152) exposing silicon layer (114) defined by field oxide film (118) is formed. On the surface of exposed silicon layer (114), a silicon oxide film for ion implanting is formed by means of thermal oxidation. Then, on the entire surface of the substrate, P (phosphorus) or As (arsenic) is ion implanted via the silicon oxide film for an ion implanting operation, so that intermediate-concentration n-type silicon region (116) is formed on exposed silicon layer (114) by means of mask (150).

Then, after removal of the ion implanting silicon oxide film and resist mask (150), a prescribed mask pattern is formed. Said high-concentration p-type contact region (130) is formed on p-type silicon region (112), and high-concentration n-type contact region (124) is formed by ion implanting in silicon region (116).

Figure 6B:
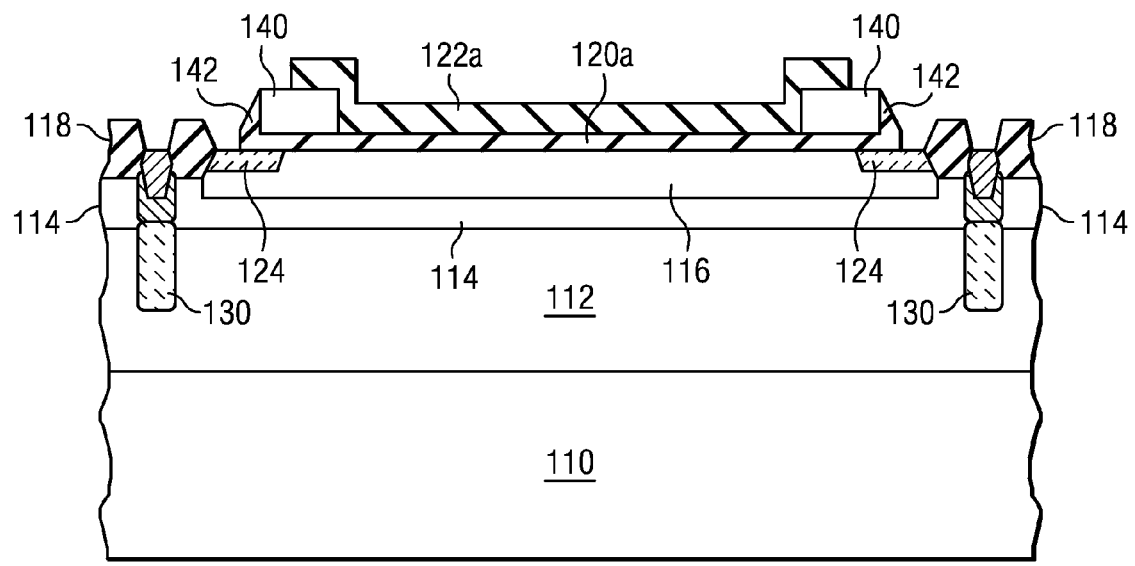

Then, as shown in FIG. 6B, silicon oxide film (120a) is formed on silicon region (116). Said silicon oxide film (120a) is formed at the same time that the gate oxide film of the MOS transistor of the peripheral circuit is formed. It is preferred that silicon oxide film (120a) be formed by means of thermal oxidation so that the silicon substrate is exposed at a prescribed temperature. In this step of operation, the dangling bonds of silicon are bonded to oxygen, and the number of dangling bonds of silicon is decreased.

Then, polysilicon layer (140) is formed on silicon oxide film (120a). Here, polysilicon layer (140) is formed at the same time that the polysilicon gate of the MOS transistor is formed.

Then, a silicon oxide film with a prescribed thickness is formed on a silicon substrate containing patterned polysilicon layer (140) and silicon oxide film (120a). Then, by means of anisotropic etching of the silicon oxide film, side wall oxide (142) consisting of silicon oxide is formed on the side wall of polysilicon layer (140).

Then, on the entire surface of the substrate, silicon nitride film (122a) is formed by means of reduced pressure CVD, followed by patterning. The film thickness of silicon nitride film (122a) is selected to be optimum corresponding to the wavelength of the incident light. As explained above, patterning is performed so that silicon nitride film (122a) covers silicon oxide film (120a) on the inner side with respect to polysilicon layer (140), and side wall oxide (142) on the outer side of polysilicon layer (140) is exposed.

Figure 7:
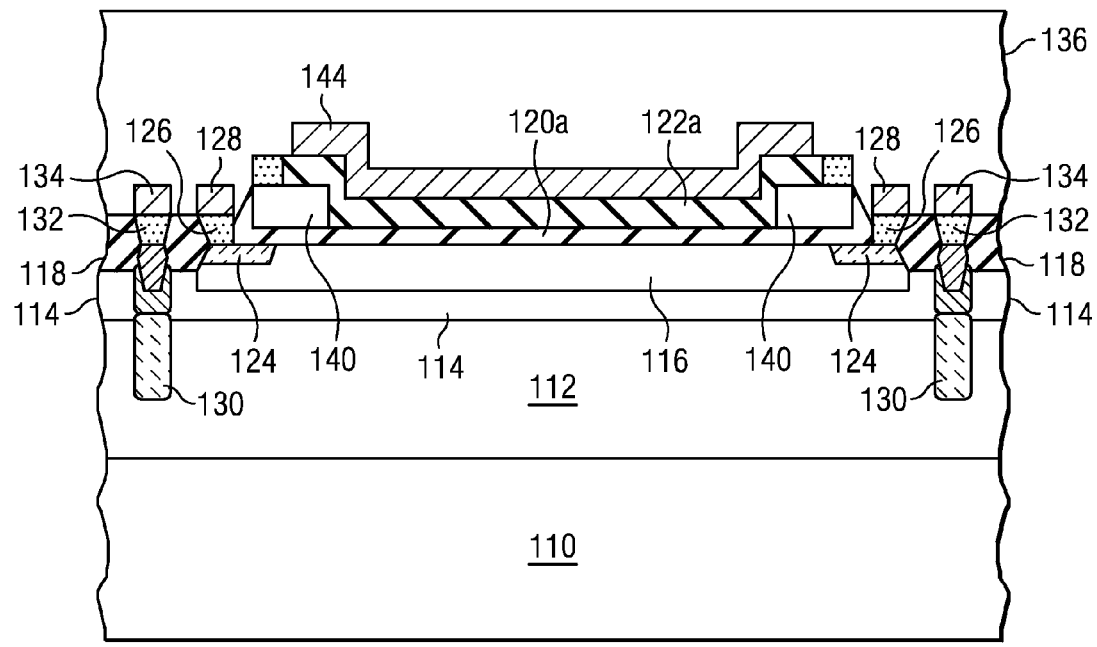
FIG. 7 is a schematic cross-sectional view illustrating the manufacturing operation for the PIN photodiode in Embodiment 1 of the present invention.

Then, as shown in FIG. 7, platinum silicide layers (126), (132) are formed in the connection region (silicon exposure portion) between field oxide film (118) and side wall oxide (142) and in the connection region (silicon exposure portion) in field oxide film (118). Then, metal wiring is formed. As a result, cathode-side electrode (128) and anode-side electrode (134) as well as metal film (144) as the etching stop layer are formed. Also, multi-layer wiring region (136) is formed by repeated film formation and etching of metal wiring and an interlayer insulating film not shown in the figure.

Then, the substrate is carried into an oven having a hydrogen atmosphere at a prescribed temperature, and hydrogen sintering is performed. By means of said treatment, hydrogen is diffused in the interlayer insulating film of multi-layer wiring region (136), and it is then diffused in side wall oxide (142), and then in silicon oxide film (120a) connected to side wall oxide (142). As a result, the silicon dangling bonds left on the surface of silicon region (116) are terminated by hydrogen, and the silicon dangling bonds can be almost entirely eliminated.

Then, on multi-layer wiring region (136), protective film (138) consisting of a silicon nitride film or the like is formed, and multi-layer wiring region (136) and protective film (138) are etched to form opening H. In this case, metal film (144) works as an etching stop layer. After formation of opening H, metal film (144) is etched off to expose silicon nitride film (122). As a result, photodiode (100A) shown in FIG. 5 can be obtained.

Figure 8A:
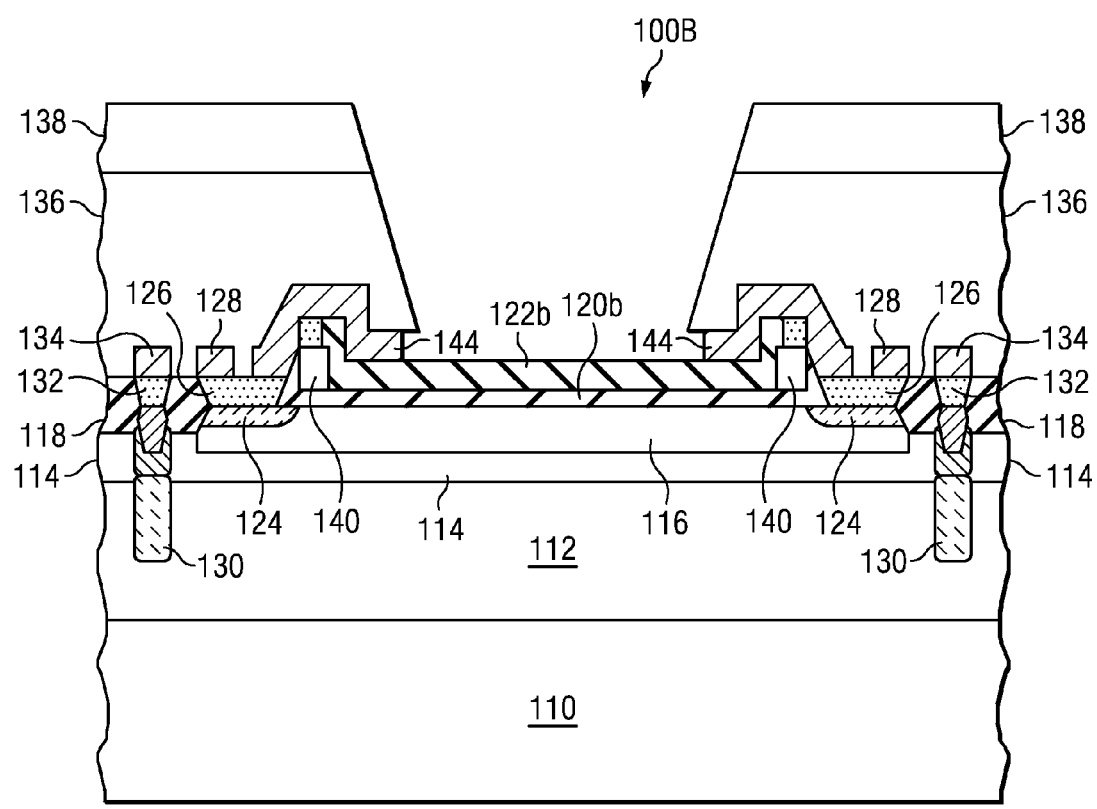
FIG. 8 is a schematic cross-sectional view illustrating the manufacturing operation for the PIN photodiode in Embodiment 2 of the present invention.
Figure 8B:
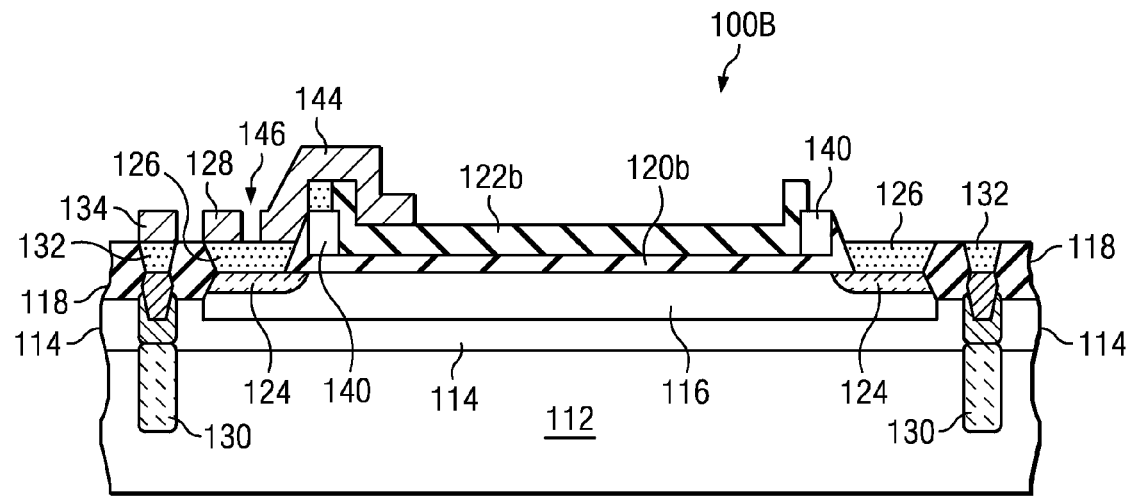

In the following, an explanation will be given regarding the PIN photodiode in Embodiment 2. FIG. 8A is a cross-sectional view illustrating PIN photodiode (100B) in Embodiment 2. FIG. 8B shows an extract of the main portion of said figure, and it shows the characteristic portion. Also, the left side of FIG. 8B shows the electrodes and metal film. On the right side, the electrodes and metal film are not shown.

On the outer periphery of silicon region (116), n-type contact region (124) is formed, and platinum silicide layer (126) is connected to it. Said cathode-side electrode (128) is connected to platinum silicide layer (126). As a characteristic feature of Embodiment 2, a portion of platinum silicide layer (126) is not covered with electrode (128) or metal film (144), and platinum silicide layer (126) is connected to side wall oxide (142). In the example shown in FIG. 8B, electrode (128) and metal film (144) are connected to platinum silicide layer (126), and exposed portion (146) is formed between electrode (128) and metal film (144). Said exposed portion (146) is formed in a rectangular shape along electrode (128).

With hydrogen sintering, hydrogen is diffused into platinum silicide layer (126) from exposed portion (146). Due to said diffusion, the ohmic resistance of platinum silicide layer (126) decreases. In addition, hydrogen that has diffused into platinum silicide layer (126) diffuses into silicon oxide film (120b) contacting platinum silicide layer (126), so the silicon dangling bonds on the surface of the silicon are bonded to hydrogen and the silicon dangling bonds are almost all eliminated.

In Embodiment 2, the constitution is such that metal film (144) is connected to platinum silicide layer (126). However, metal film (144) does not have to be connected to platinum silicide layer (126). One may also adopt a scheme in which an opening is formed on electrode (128) for use as exposed portion (146). In addition, by means of metal film (144), side wall oxide (142) of polysilicon layer (140) is exposed, and, just as in Embodiment 1, hydrogen diffusion can be performed from side wall oxide (142).

Figure 9A:
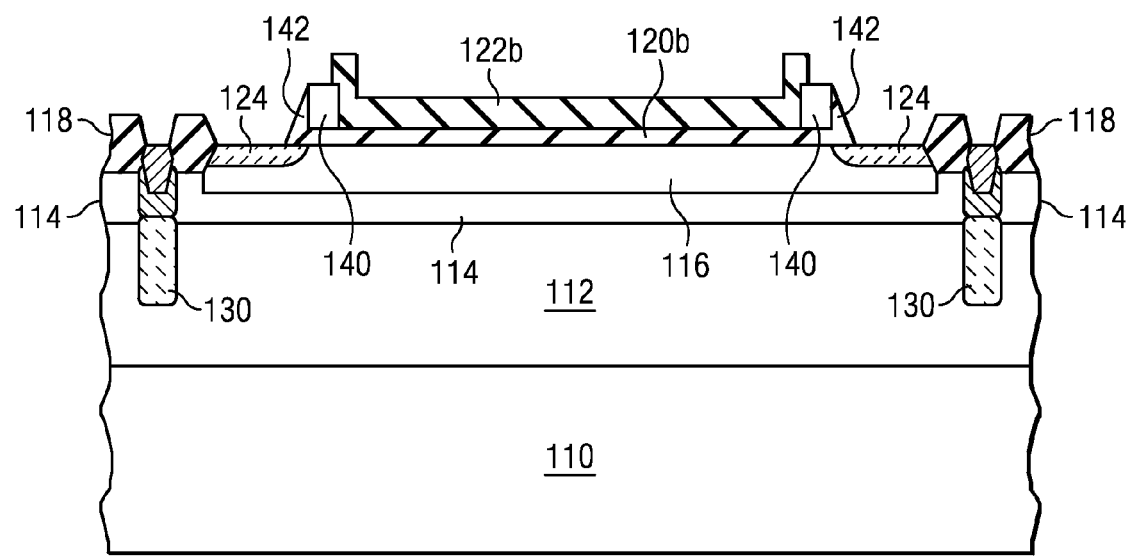
FIG. 9 is a diagram illustrating the manufacturing operation of Embodiment 2 of the present invention.

In the following, an explanation will be given regarding the manufacturing method for the photodiode in Embodiment 2, with reference to FIGS. 9 and 10. First, as shown in FIG. 6A, just as in Embodiment 1, intermediate-concentration silicon region (116) is formed on silicon layer (114). Then, silicon oxide film (120b) and polysilicon layer (140) are formed. After they are patterned, ion implanting is performed to form contact regions (124), (130). Then, side wall oxide (142) is formed on the side wall of polysilicon layer (140), and silicon nitride film (122b) is formed to cover silicon oxide film (120a).

Figure 9B:
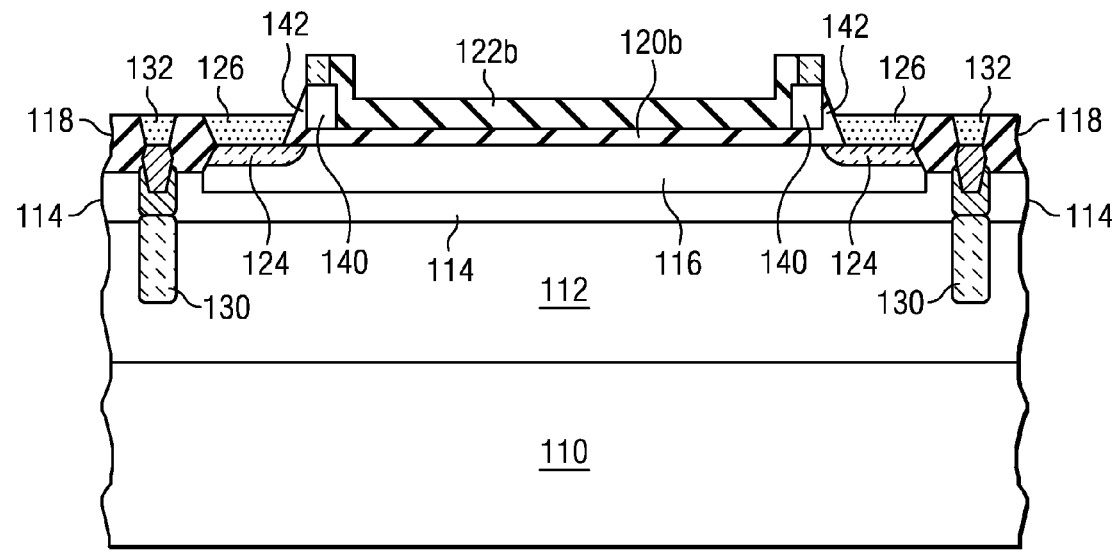
Figure 10A:
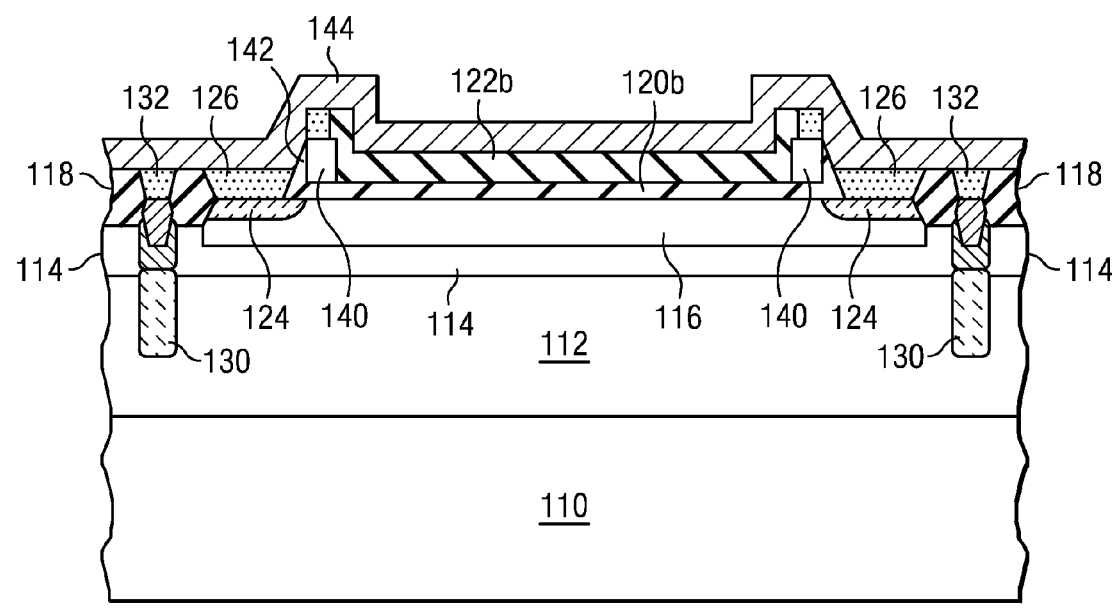
FIG. 10 is a diagram illustrating the manufacturing operation of Embodiment 2 of the present invention.
Figure 10B:
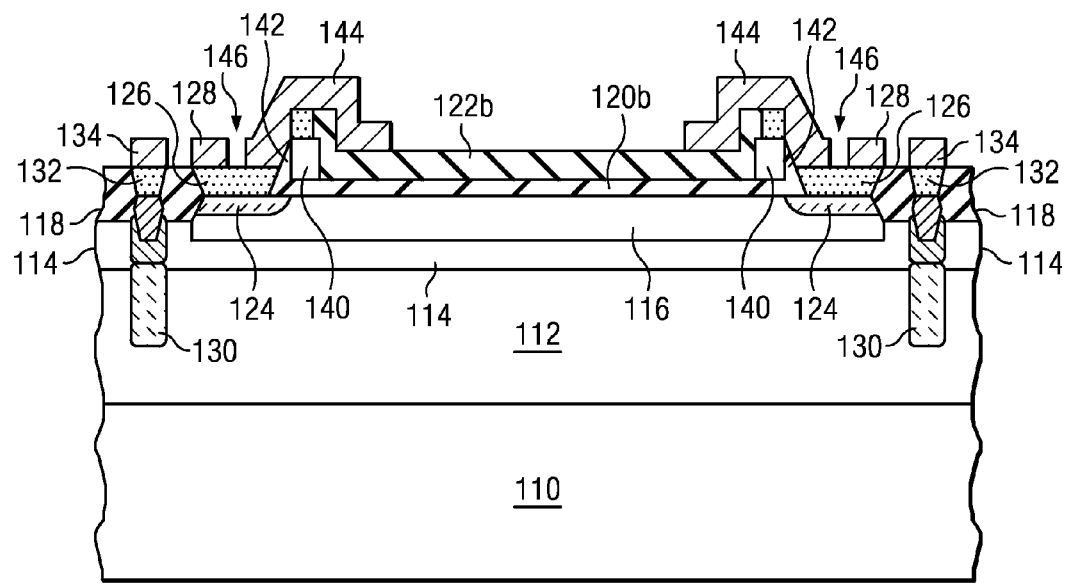

Then, as shown in FIG. 9B, platinum silicide layers (126), (132) are formed and connected to contact regions (124), (130), respectively. Then, as shown in FIG. 10A, metal film (144) is formed. Then, metal film (144) is etched to a prescribed pattern using a photolithographic operation. As shown in FIG. 10B, cathode-side electrode (128), anode-side electrode (134) and metal film (144) as the etching stop layer are formed. Said exposed portion (146) is formed between cathode-side electrode (128) and metal film (144) to expose platinum silicide layer (126).

In the following steps of operation, just as in Embodiment 1, hydrogen sintering, formation of protective film (138), and formation of opening H are performed.

Figure 11:
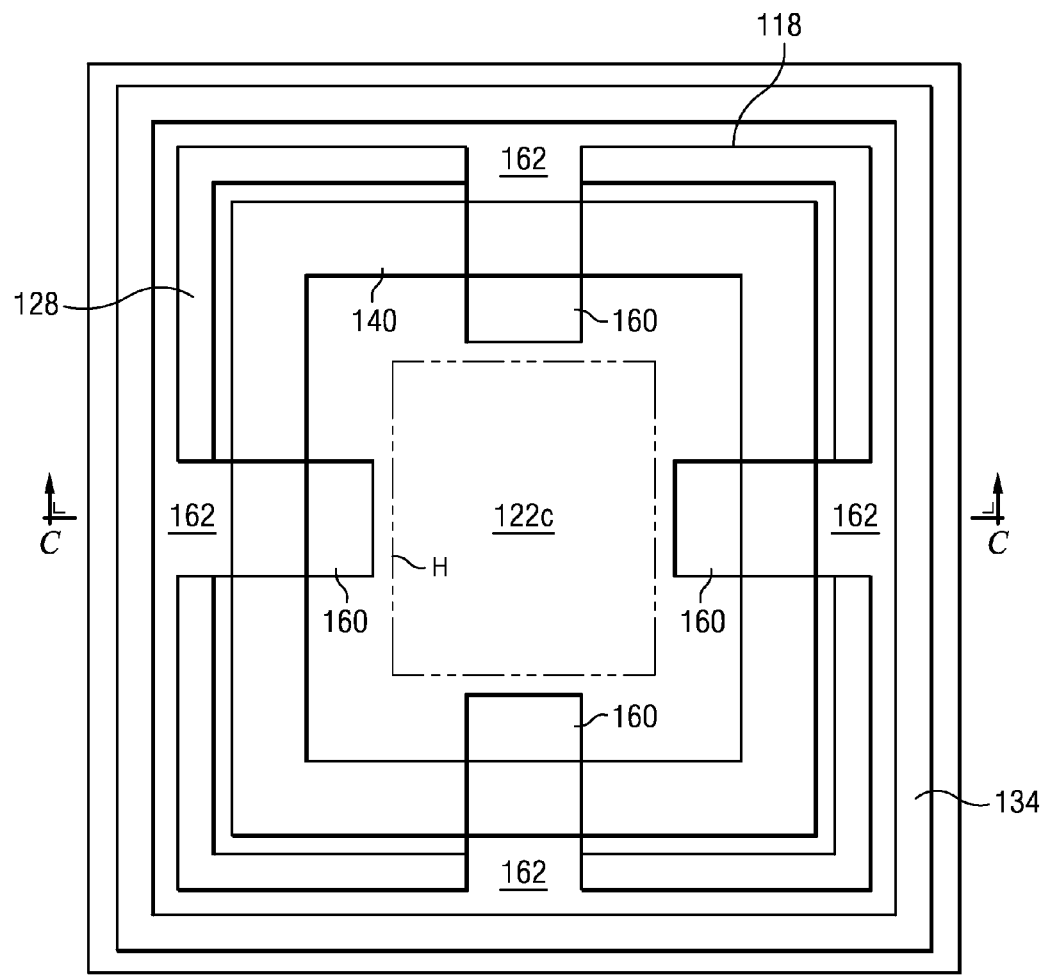
FIG. 11 is a schematic plan view illustrating the active region of the PIN photodiode in Embodiment 3 of the present invention.
Figure 12A:
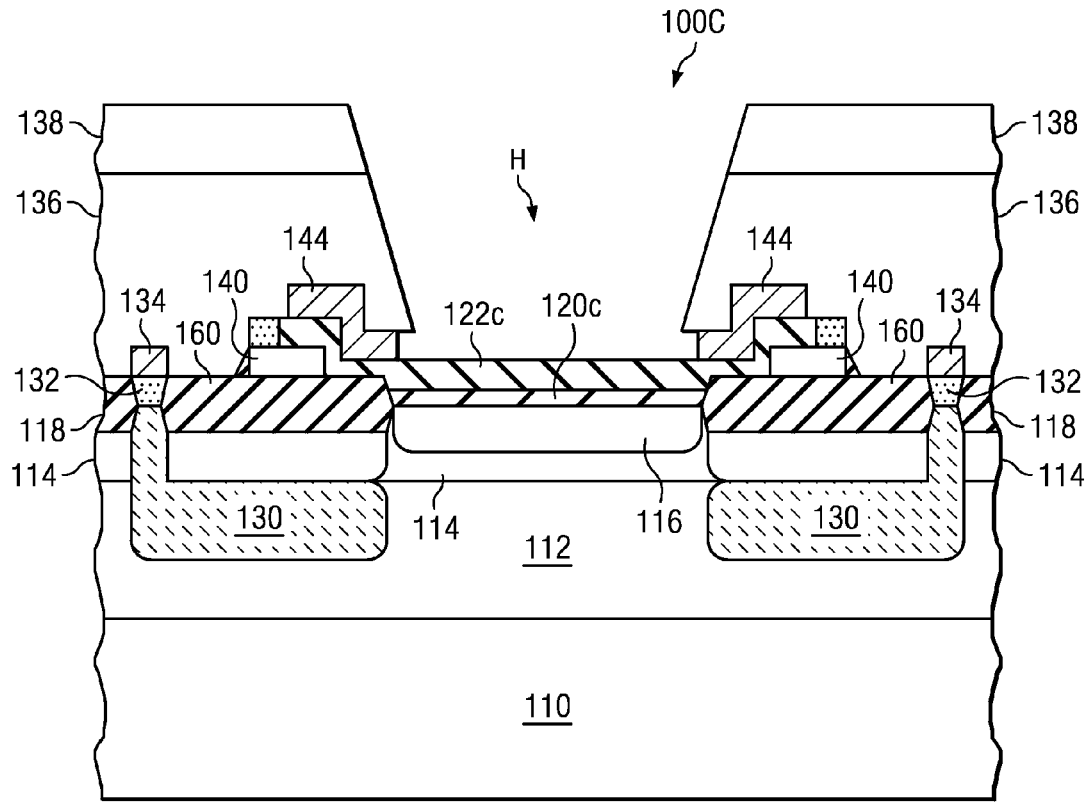
FIG. 12A is cross-sectional view taken across C-C in FIG. 11.
Figure 12B:
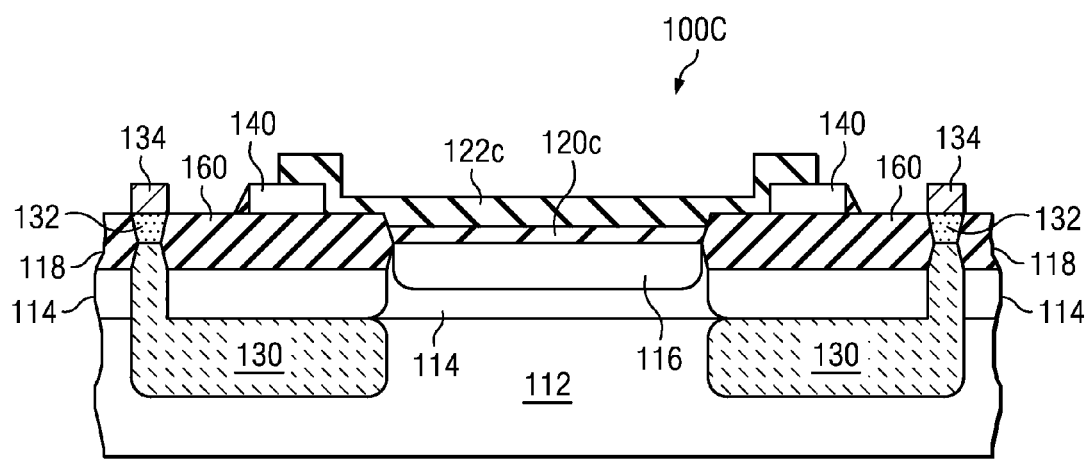
FIG. 12B extracts the main portion of FIG. 12A, and it is a cross-sectional view illustrating the characteristic portion.

In the following, an explanation will be given regarding Embodiment 3 of the present invention. FIG. 11 is a schematic plan view illustrating the active region of a photodiode. FIG. 12A is a cross-sectional view taken across C-C in FIG. 11. FIG. 12B extracts the main portion of FIG. 12A, and it shows the characteristic portion of Embodiment 3.

As shown in FIG. 11, in Embodiment 3, field oxide film (118) has four rectangular-shaped extending portions (160) extending inward. It is preferred that the tips of extending portions (160) stop just before opening H. Also, cathode-side electrode (128) has four discontinuous portions (162) formed by means of extending portions (160).

In Embodiment 3, PIN photodiode (100C) uses a field oxide film as the region for hydrogen diffusion. As shown in FIGS. 12A, 12B, on extending portions (160) of field oxide film (118), polysilicon layer (140) is formed, and silicon nitride film (122c) is formed on the inner side with respect to polysilicon layer (140). That is, a portion of the surface of extending portions (160) is exposed from silicon nitride film (122c) and the electrode. The exposed surface works as the region for hydrogen diffusion. Also, the end portions of extending portions (160) are connected to silicon oxide film (120c) such that hydrogen diffusing in extending portions (160) can diffuse in silicon oxide film (120c) and silicon dangling bonds can be terminated by hydrogen.

In the following, an explanation will be given regarding the manufacturing operation of the PIN photodiode in Embodiment 3 with reference to FIGS. 13 and 14. FIGS. 13 and 14 correspond to cross-section taken across C-C.

Figure 13A:
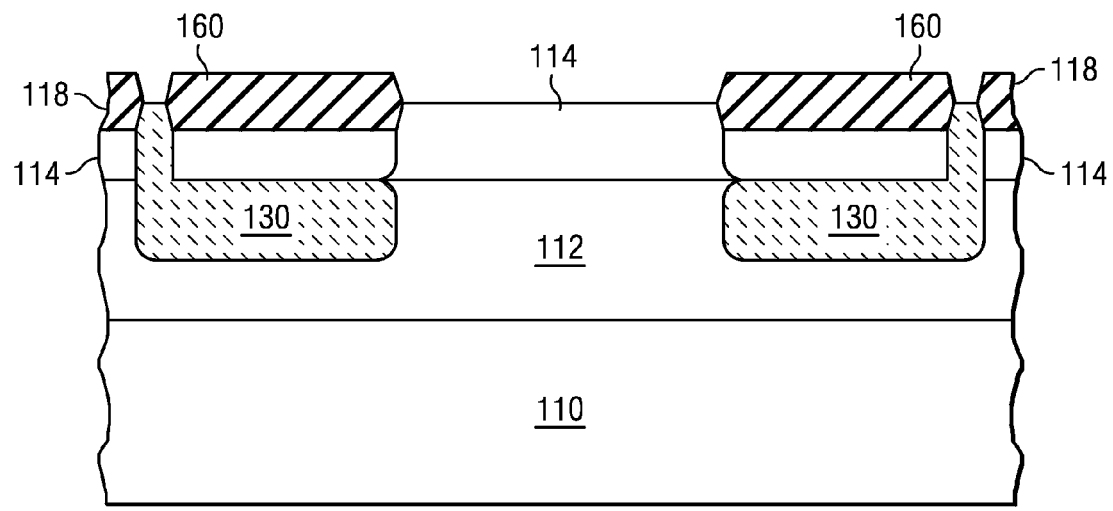
FIG. 13: is a diagram illustrating the manufacturing operation of Embodiment 3 of the present invention.

As shown in FIG. 13A, a mask not shown in the figure is used, a p-type impurity is ion implanted into silicon region (112), and the p-type impurity is implanted in silicon layer (114). Then, the mask is used for selective oxidation of silicon layer (114), and field oxide film (118) containing extending portions (160) is formed. As a result, a channel stop region and contact region (130) are formed beneath field oxide film (118).

Figure 13B:
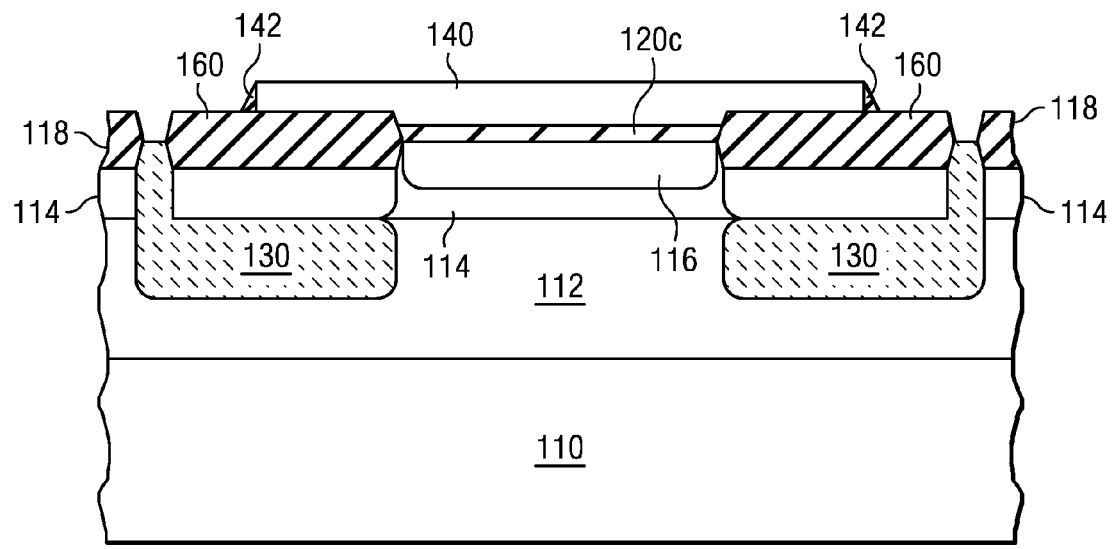

Then, as shown in FIG. 13B, silicon region (116) is formed at a prescribed depth in silicon layer (114), and silicon oxide film (120c) covering silicon region (116) is formed. In addition, polysilicon layer (140) is formed, and side wall oxide (142) is formed on the side wall of polysilicon layer (140).

Figure 14A:
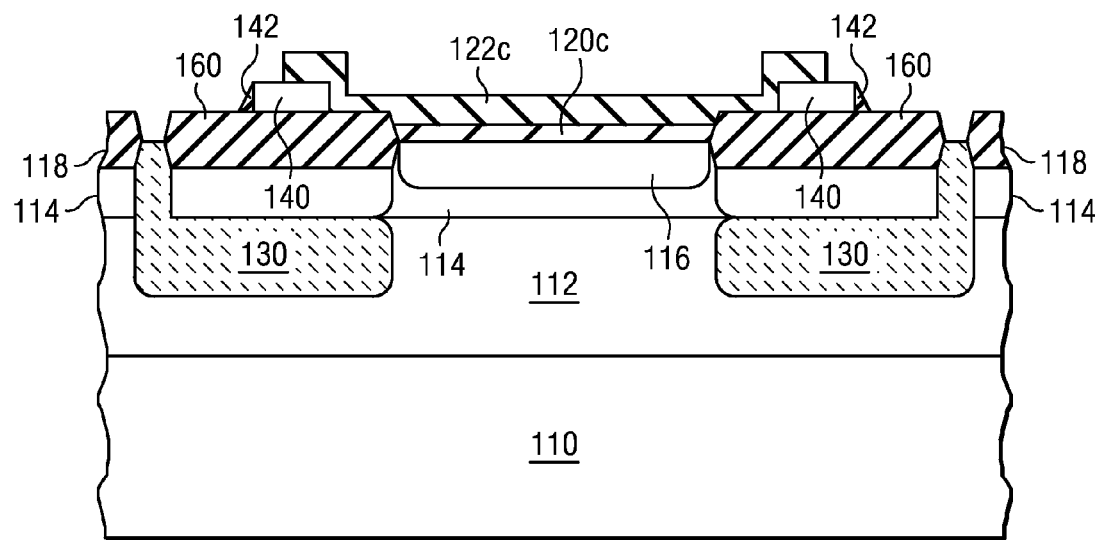
FIG. 14 is a diagram illustrating the manufacturing operation of Embodiment 3 of the present invention.

Then, as shown in FIG. 14A, polysilicon layer (140) is patterned, and silicon nitride film (122c) is formed to cover silicon oxide film (120c).

Figure 14B:
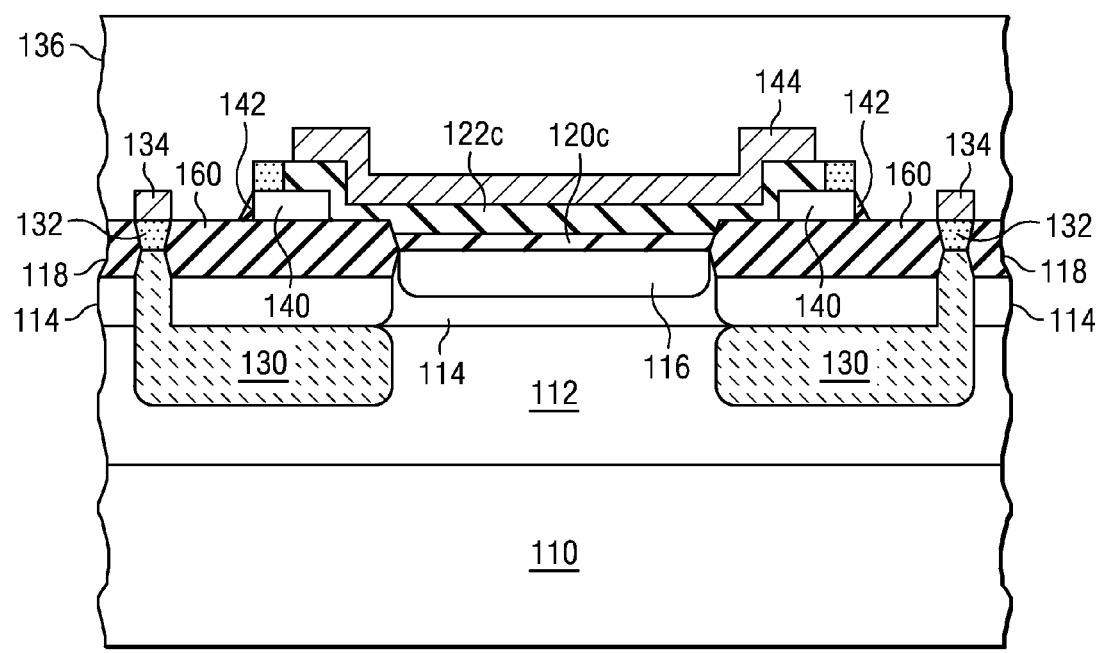

Then, as shown in FIG. 14B, a platinum silicide layer is formed in the connection region (silicon exposed portion) in field oxide film (118). Then, a cathode-side electrode and anode-side electrode as well as metal film (144) as an etching stop layer are formed, and multi-layer wiring region (136) is formed.

Figure 15:
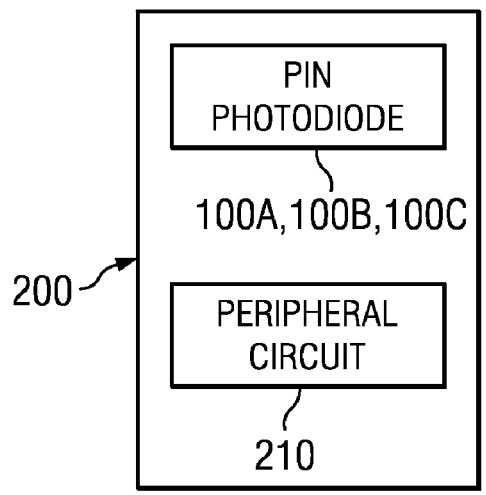
FIG. 15 is a diagram illustrating an example of an optical pickup using the PIN photodiode of the present embodiment.

Then, hydrogen sintering is performed. Hydrogen is diffused from multi-layer wiring region (136) into exposed extending portions (160) of field oxide film (118), and then into FIG. 15 is a diagram illustrating an example of a semiconductor device having the PIN photodiode of the present embodiment. For the semiconductor device, on one semiconductor chip (200), PIN photodiodes (100A), (100B) and (100C) can be integrated to peripheral circuit (210). Said peripheral circuit (210) contains plural MOS transistors, etc.

Figure 16:
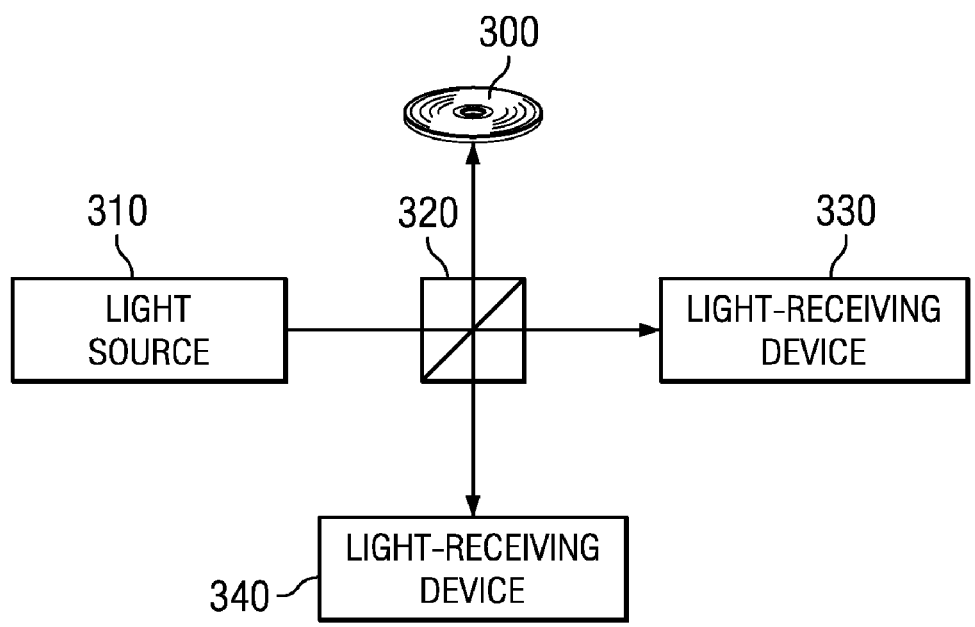
FIG. 16 is a diagram illustrating an example of a circuit formed on the silicon chip of the light-receiving device shown in FIG. 15.

FIG. 16 shows an embodiment of a semiconductor device having the PIN photodiode in the present embodiment in an optical pickup. Here, an optical pickup is a device for optical read of data recorded on a disk that is driven to rotate and for optical write of data onto the disk. Said optical pickup (300) has light source (310) containing a laser element or laser diode elements emits blue light, splitter (320), and light-receiving devices (330), (340). Here, splitter (320) reflects the blue light emitted from light source (310) to disk D, and, at the same time, it passes through a portion of the light to light-receiving device (330) and passes through the reflected light of disc D to light-receiving device (340). The light output from light source (310) is monitored by light-receiving device (330), and, based on the result, the optical output of the blue light is stabilized. Said light-receiving device (340) monitors the reflected light of disk D, and, based on the result, focus control and tracking control are performed. Light-receiving device (340) is also used to read the data written on disk D. Said light-receiving devices (330), (340) each contain semiconductor device (200) having a PIN photodiode for receiving blue light.

With the PIN photodiode of the present embodiment with said constitution, the sensitivity in all of the aforementioned embodiments can be improved over that of a conventional PIN photodiode (FIG. 2).

In the above, preferable embodiments of the present invention have been explained in detail. However, the present invention is not limited to said specific embodiments. Various modifications and changes may be adopted as long as the gist of the present invention described in the Claims is observed.

In said embodiments, a manufacturing method in which a PIN photodiode and MOS transistors are contained in a silicon chip is shown as an example. However, clearly, a manufacturing method for only a PIN photodiode that does not contain MOS transistors may also adopt the present invention. In addition, in said embodiments, silicon nitride film is used as the anti-reflection film. However, another dielectric film may be used instead, or a combination may be adopted. In addition, the anti-reflection film may be either a single-layer or multi-layer film. In said embodiments, a silicon layer is formed by means of epitaxial growth on a silicon substrate. However, the present invention is not limited to epitaxial growth. In addition, in said embodiments, a platinum silicide layer is presented as an example of a silicide. However, one may also adopt another metal silicide. In said embodiments, the photodiode has a rectangular shape. However, one may also adopt a round shape or another shape.

What is claimed is:

1. A semiconductor device characterized by the following facts:
    a semiconductor device containing a photodiode has the following parts:
        a first silicon layer of a first electroconductive type formed on a substrate,
        a second silicon layer of a second electroconductive type formed on said first silicon layer,
        a silicon oxide region defining an active region of the second silicon layer,
        a silicon oxide film covering the surface of said active region,
        and a silicon nitride film that covers at least said silicon oxide film;
        a side wall oxide is connected to said silicon oxide film, and at least a portion of said side wall oxide is exposed as a region for hydrogen diffusion, and
    said photodiode detects light incident on said active region.

2. The semiconductor device described in claim 1, characterized by the following facts:
    the semiconductor device also has a peripheral circuit containing a MOS transistor electrically connected to said photodiode;
    a gate electrode material is electrode material formed when the gate of said MOS transistor is formed; and
    said side wall oxide is silicon oxide formed at the same time that the side wall oxide is formed on the side wall of the gate.

3. The semiconductor device described in claim 2, characterized by the fact that said gate electrode material is formed along the outer periphery of said active region, and said side wall oxide is formed on the outer side of said gate electrode material.

4. The semiconductor device described in claim 1, characterized by the fact that the second silicon layer contains a high-impurity-concentration region at a prescribed depth from its surface.

5. The semiconductor device described in claim 1, characterized by the fact that said silicon oxide film is formed by means of thermal oxidation.

6. A semiconductor device characterized by the following facts:
a semiconductor device containing a photodiode has the following parts:
a first silicon layer of a first electroconductive type formed on a substrate,
a second silicon layer of a second electroconductive type formed on said first silicon layer,
a silicon oxide region defining the active region of the second silicon layer,
a silicon oxide film covering the surface of said active region,
a silicon nitride film that covers at least said silicon oxide film,
a silicide layer that is formed along the outer periphery of said active region and via a connection region formed between said silicon oxide region and said silicon oxide film,
and an electrode formed on said silicide layer;
the side portion of said silicide layer is connected to said silicon oxide film, and at least a portion of the surface of said silicide layer is exposed as a region for hydrogen diffusion;
and said photodiode detects light incident on said active region.

7. The semiconductor device described in claim 6, characterized by the fact that said silicide layer is a platinum silicide layer.

8. The semiconductor device described in claim 6 or 7, characterized by the fact that a side portion of said silicide layer is connected via a side wall oxide of a gate electrode material to said silicon oxide film.

* * * * *